US006658605B1

(12) United States Patent
Yoshida et al.

(10) Patent No.: US 6,658,605 B1
(45) Date of Patent: Dec. 2, 2003

(54) MULTIPLE CODING METHOD AND APPARATUS, MULTIPLE DECODING METHOD AND APPARATUS, AND INFORMATION TRANSMISSION SYSTEM

(75) Inventors: Hideo Yoshida, Tokyo (JP); Takahiko Nakamura, Tokyo (JP); Hachiro Fujita, Tokyo (JP); Yoshikuni Miyata, Tokyo (JP); Kazuo Kubo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 396 days.

(21) Appl. No.: 09/703,638

(22) Filed: Nov. 2, 2000

(30) Foreign Application Priority Data

Nov. 5, 1999 (JP) .......................... 11-315832

(51) Int. Cl.[7] .............................................. G11C 29/00
(52) U.S. Cl. ....................... 714/702; 714/755; 714/784
(58) Field of Search ................................ 714/701, 702, 714/755, 784

(56) References Cited

U.S. PATENT DOCUMENTS

| | | | |
|---|---|---|---|
| 4,680,764 A | | 7/1987 | Tsuneo et al. |
| 5,473,601 A | * | 12/1995 | Rosen et al. |
| 5,631,927 A | | 5/1997 | Caia et al. |
| 5,721,745 A | * | 2/1998 | Hladik et al. |
| 5,996,104 A | * | 11/1999 | Herzberg .................... 714/755 |

FOREIGN PATENT DOCUMENTS

JP          10190486         7/1998

OTHER PUBLICATIONS

Imai, H., "Coding Theory", Institute of Electronics, Information and Communication Engineers of Japan, 1990, pp. 238–244 (English translation of relevant part attached).
Forney, Jr., G. David, "Concatenated Codes" Research Monograph, No. 37, 1966, pp. 1–11.

* cited by examiner

Primary Examiner—Phung M. Chung
(74) Attorney, Agent, or Firm—Birch, Stewart, Kolasch & Birch, LLP

(57) ABSTRACT

A multiple coding apparatus comprises a first encoder for encoding a plurality of input sequences in parallel so as to generate a plurality of output coded sequences in parallel while adding an error-correcting bit sequence to each of the plurality of input sequences. An interleaving circuit interleaves the plurality of output coded sequences applied thereto in parallel from the first encoder without having to use any memory. The interleaving circuit permutes the plurality of input sequences on a bit-by-bit or symbol-by-symbol basis so as to generate a plurality of interleaved coded sequences in parallel. A second encoder then encodes the plurality of interleaved coded sequences applied thereto in parallel from the interleaving circuit so as to generate a plurality of output coded sequences in parallel while adding an error-correcting bit sequence to each of the plurality of interleaved coded sequences.

20 Claims, 7 Drawing Sheets

MULTIPLE CODING METHOD AND APPARATUS, MULTIPLE DECODING METHOD AND APPARATUS, AND INFORMATION TRANSMISSION SYSTEM

BACKGROUND OF THE INVENTION

1. Field of the Invention

The present invention relates to a multiple coding method and apparatus and a multiple decoding method and apparatus for detecting and correcting (or checking) errors that have occurred in a transmission medium, such as an optical cable, disposed in an information transmission system, or a storage medium, such as a hard disk drive, disposed in an information processing system. It also relates to an information transmission system including such a multiple coding apparatus and such a multiple decoding apparatus. More particularly, the present invention relates to an improvement in a multiple coding and decoding arrangement, typified by a product coding and decoding arrangement or a concatenated coding and decoding arrangement, aimed for improving error detecting and correcting performances, which is employed to efficiently reduce a delay in the information transmission caused by the multiple coding and decoding technique, thus providing a high transmission rate.

2. Description of the Prior Art

Prior art techniques of performing coding a number of times are disclosed by H. Imai, "Coding theory", published in 1990 by the Institute of Electronics, Information and Communication Engineers, Japan, and Japanese patent application publication (TOKKAIHEI) No. 10-190486, for example. Referring now to FIG. 6, there is illustrated a block diagram showing the structure of a prior art information transmission system for performing coding and decoding a number of times and for transmitting a sequence of pieces of information. In the figure, reference numeral 29 denotes a concatenated coding apparatus, numeral 30 denotes a concatenated decoding apparatus, and numeral 3 denotes a transmission medium connected between the concatenated coding apparatus 29 and the concatenated decoding apparatus 30.

The concatenated coding apparatus 29 includes an information sequence input circuit 31 for receiving an input sequence of pieces of information, a Reed-Solomon outer encoder 32 for encoding the input information sequence, an interleaving memory 33 for sequentially storing a plurality of outer coded sequences from the Reed-Solomon outer encoder, an address generating circuit 34 for controlling writing and reading to and from the interleaving memory 33, an Reed-Solomon inner encoder 35 for further encoding an input sequence read out of the interleaving memory 33, and a concatenated coded sequence output circuit 36 for furnishing a sequence of inner coded data from the Reed-Solomon inner encoder as an output sequence of concatenated coded data to the transmission medium 3.

The concatenated decoding apparatus 30 includes a concatenated coded sequence input circuit 37 for receiving an input sequence of concatenated coded data, an Reed-Solomon inner decoder 38 for decoding the input concatenated coded sequence, a de-interleaving memory 39 for sequentially storing a plurality of sequences of inner decoded data from the Reed-Solomon inner decoder, an address generating circuit 40 for controlling writing and reading to and from the de-interleaving memory 39, an Reed-Solomon outer decoder 41 for further decoding a sequence of decoded data read out of the de-interleaving memory, and an information sequence output circuit 42 for furnishing a sequence of outer decoded data from the Reed-Solomon outer decoder as an output sequence of pieces of information.

In operation, when an information sequence is applied to the information sequence input circuit 31, the Reed-Solomon outer encoder 32 encodes the input information sequence and sequentially stores the outer coded sequence from the outer encoder in the interleaving memory 33. When a predetermined number of outer coded sequences are written into the interleaving memory 33, the address generating circuit 34 makes the interleaving memory 33 sequentially furnish those sequences in an order opposite to the order in which they have been written into the interleaving memory. The Reed-Solomon inner encoder 35 further encodes the plurality of data sequences read out of the interleaving memory and generates a plurality of inner coded sequences, and the concatenated coded sequence output circuit 36 then furnishes the plurality of inner coded sequences from the Reed-Solomon encoder as a plurality of concatenated coded sequences to the transmission medium 3.

When the concatenated coded sequence input circuit 37 receives an input concatenated coded sequence of by way of the transmission medium 3, the Reed-Solomon inner decoder 38 decodes the input concatenated coded sequence and then stores the decoded result in the de-interleaving memory 39 sequentially. When a predetermined number of sequences of inner decoded data are written into the de-interleaving memory, the address generating circuit 40 makes the de-interleaving memory 39 sequentially furnish those sequences in an order opposite to the order in which they have been written into the de-interleaving memory. The Reed-Solomon outer decoder 41 further decodes the plurality of data sequences read out of the de-interleaving memory and generates a plurality of sequence of outer decoded data, and the information sequence output circuit 42 then furnishes the plurality of sequence of outer decoded data as a plurality of sequences of output information sequentially.

In this way, the prior art information transmission system can sequentially supply a plurality of information sequences to the concatenated coding apparatus 29, and then transmit a plurality of concatenated coded sequences generated by the concatenated coding apparatus 29, by way of the transmission medium 3, to the concatenated decoding apparatus 30 which decodes the plurality of concatenated coded sequences, so that the receive side of the system can get the plurality of information sequences error-detected and error-corrected.

A problem with prior art information transmission systems constructed as above is that in the concatenated coding apparatus 29, for example, the interleaving memory 33 has to have enough storage amount to sequentially store a predetermined number of outer coded sequences generated by the Reed-Solomon outer encoder 32 because the plurality of outer coded sequences must be sequentially read out of the interleaving memory 33 in an order opposite to the order in which they have been written into the interleaving memory in order to make the coding directions of the two encoders 32 and 35 differ from each other, thereby providing high error-detecting and error-correcting performances, and it is therefore impossible to read the next set of outer coded sequences until the writing of the previous set of outer coded sequences to the interleaving memory 33 is completed, thus causing a very long time delay in the coding process.

Referring next to FIG. 7, there is illustrated a format diagram for explaining the writing and reading operations of the interleaving memory 33 of the prior art information transmission system of FIG. 6. FIG. 7 shows an example in which the plurality of outer coded sequences from the Reed-Solomon outer encoder are written into the interleaving memory 33 such that they are running along columns from the leftmost column to the rightmost column, and a plurality of rows are sequentially read out of the interleaving memory, starting from the uppermost row, after the last outer coded sequence is written into the rightmost column. In the case of the use of such the interleaving memory 33, the reading process of reading the plurality of coded sequences running along rows cannot be performed until the writing process of writing the plurality of outer coded sequences into the memory locations from the leftmost column to the rightmost column is completed, thus causing a time delay. FIG. 8 shows an example in which the plurality of outer coded sequences are written into the interleaving memory 33 such that each of them is split across some columns.

Consequently, the total amount of memory required for interleaving processes and the total time delay caused by the interleaving processes increase with increase in the number of encoders disposed in the concatenated coding apparatus 29. Since the information transmission rate cannot exceed the maximum one limited by the total time delay, it is difficult to improve the transmission rate while ensuring the reliability of information transmitted. The concatenated decoding apparatus 30 has the same problem too.

SUMMARY OF THE INVENTION

The present invention is proposed to solve the above problem. It is therefore an object of the present invention to provide a multiple coding method and apparatus for performing coding having different coding directions a number of times with a shorter time delay than do prior art information transmission systems, thus providing a higher transmission rate than do prior art information transmission systems while ensuring the reliability of information transmitted, a multiple decoding method and apparatus for performing decoding having different decoding directions a number of times with a shorter time delay than do prior art information transmission systems, thus providing a higher transmission rate than do prior art information transmission systems while ensuring the reliability of information received, and an information transmission system including such a multiple coding apparatus and such a multiple decoding apparatus.

In accordance with one aspect of the present invention, there is provided a multiple coding method comprising the steps of: encoding a plurality of input sequences in parallel so as to generate a plurality of output coded sequences in parallel while adding an error-correcting bit sequence to each of the plurality of input sequences; interleaving the plurality of output coded sequences applied thereto in parallel by permuting the plurality of output coded sequences on a bit-by-bit or symbol-by-symbol basis so as to generate a plurality of interleaved sequences in parallel; and encoding the plurality of interleaved sequences in parallel so as to generate a plurality of output coded sequences in parallel while adding an error-correcting bit sequence to each of the plurality of interleaved sequences.

Preferably, the plurality of input sequences to be encoded in the first encoding step are equal in number to those to be encoded in the second encoding step, and the plurality of interleaved sequences generated in the interleaving step are equal in number to the plurality of output coded sequences generated in the first encoding step.

In accordance with a preferred embodiment of the present invention, the interleaving step includes the steps of counting a number of bits or symbols sequentially applied thereto and included in one input sequence generated in the first encoding step, and changing a permutation of the plurality of parallel bits or symbols every time a count value obtained in the counting step increments by one.

In accordance with another aspect of the present invention, there is provided a multiple decoding method comprising the steps of: decoding a plurality of input sequences in parallel based on an error-correcting bit sequence included in each of the plurality of input sequences so as to generate a plurality of output decoded sequences in parallel; de-interleaving the plurality of output decoded sequences applied thereto in parallel by permuting the plurality of output decoded sequences on a bit-by-bit or symbol-by-symbol basis so as to generate a plurality of de-interleaved decoded sequences in parallel such that the plurality of de-interleaved decoded sequences are a same order as a corresponding plurality of input, sequences before they were interleaved through a corresponding interleaving process; and decoding the plurality of de-interleaved decoded sequences in parallel based on an error-correcting bit sequence included in each of the plurality of de-interleaved decoded sequences so as to generate a plurality of output decoded sequences in parallel.

Preferably, the plurality of input sequences to be decoded in the first decoding step are equal in number to those to be decoded in the second decoding step, and the plurality of de-interleaved decoded sequences generated in the de-interleaving step are equal in number to the plurality of output decoded sequences generated in the first decoding step.

In accordance with a preferred embodiment of the present invention, the de-interleaving step includes the steps of counting a number of bits or symbols sequentially applied thereto and included in one output decoded sequence generated in the first decoding step, and changing a permutation of the plurality of parallel bits or symbols every time a count value obtained in the counting step increments by one.

In accordance with a further aspect of the present invention, there is provided a multiple coding apparatus comprising: a first encoder for encoding a plurality of input sequences in parallel so as to generate a plurality of output coded sequences in parallel while adding an error-correcting bit sequence to each of the plurality of input sequences; an interleaving circuit for interleaving a plurality of input sequences that are the plurality of output coded sequences applied thereto in parallel from the first encoder by permuting the plurality of input sequences on a bit-by-bit or symbol-by-symbol basis so as to generate a plurality of interleaved coded sequences in parallel; and a second encoder for encoding the plurality of interleaved coded sequences applied thereto in parallel from the interleaving circuit so as to generate a plurality of output coded sequences in parallel while adding an error-correcting bit sequence to each of the plurality of interleaved coded sequences.

Preferably, the plurality of input sequences to be encoded by the first encoder are equal in number to those to be encoded by the second encoder, and the plurality of interleaved coded sequences generated by the interleaving circuit are equal in number to the plurality of output coded sequences generated by the first encoder.

In accordance with a preferred embodiment of the present invention, the interleaving circuit includes a counter for counting a number of bits or symbols sequentially applied thereto and included in one input sequence from the first encoder, and a plurality of selectors each of which selects a different input sequence from the plurality of input sequences on a bit-by-bit or symbol-by-symbol basis according to a count value of the counter, and furnishes the selected input sequence as one interleaved coded sequence on a bit-by-bit or symbol-by-symbol basis, a number of the plurality of selectors being equal to a number of the plurality of input sequences. Each of the plurality of selectors can select the same input sequence every time it performs the selection a predetermined number of times corresponding to the number of the plurality of input sequences.

In accordance with another preferred embodiment of the present invention, each of the first and second encoders adds the error-correcting bit sequence to each of the plurality of input sequences applied thereto using a Reed-Solomon coding method.

In accordance with another preferred embodiment of the present invention, the multiple coding apparatus further comprises a second interleaving circuit for interleaving a plurality of input sequences applied thereto in parallel by permuting the plurality of input sequences on a bit-by-bit or symbol-by-symbol basis so as to generate and furnish a plurality of interleaved sequences in parallel to the first encoder.

In accordance with another aspect of the present invention, there is provided a multiple decoding apparatus comprising: a first decoder for decoding a plurality of input sequences in parallel based on an error-correcting bit sequence included in each of the plurality of input sequences so as to generate a plurality of output decoded sequences in parallel; a de-interleaving circuit for de-interleaving a plurality of input sequences that are the plurality of output decoded sequences applied thereto in parallel from the first decoder by permuting the plurality of output decoded sequences on a bit-by-bit or symbol-by-symbol basis so as to generate a plurality of de-interleaved decoded sequences in parallel such that the plurality of de-interleaved decoded sequences are a same order as a corresponding plurality of input sequences before they were interleaved through a corresponding interleaving method; and a second decoder for decoding the plurality of de-interleaved decoded sequences applied thereto in parallel from the de-interleaving circuit based on an error-correcting bit sequence included in each of the plurality of de-interleaved decoded sequences so as to generate a plurality of output decoded sequences in parallel.

Preferably, the plurality of input sequences to be decoded by the first decoder are equal in number to those to be decoded by the second decoder, and the plurality of de-interleaved decoded sequences generated by the de-interleaving circuit are equal in number to the plurality of output decoded sequences generated by the first decoder.

In accordance with another preferred embodiment of the present invention, the de-interleaving circuit includes a counter for counting a number of bits or symbols sequentially applied thereto and included in one input sequence from the first decoder, and a plurality of selectors each of which selects a different input sequence from the plurality of input sequences on a bit-by-bit or symbol-by-symbol basis according to a count value of the counter, and furnishes the selected input sequence as one de-interleaved decoded sequence on a bit-by-bit or symbol-by-symbol basis, a number of the plurality of selectors being equal to a number of the plurality of input sequences. Each of the plurality of selectors can select the same input sequence every time it performs the selection a predetermined number of times corresponding to the number of the plurality of input sequences.

In accordance with another preferred embodiment of the present invention, each of the first and second decoders decodes the plurality of input sequences applied thereto in parallel using a Reed-Solomon coding method.

In accordance with another preferred embodiment of the present invention, the multiple decoding apparatus further comprises an interleaving circuit for interleaving the plurality of output decoded sequences applied thereto in parallel from the second decoder by permuting the plurality of output decoded sequences on a bit-by-bit or symbol-by-symbol basis so as to generate a plurality of interleaved decoded sequences in parallel, a third decoder for performing a same decoding process as performed by the first decoder on the plurality of interleaved decoded sequences applied thereto in parallel from the interleaving circuit so as to generate a plurality of output decoded sequences in parallel, a second de-interleaving circuit for performing a same de-interleaving process as performed by the first de-interleaving circuit on the plurality of output decoded sequences applied thereto in parallel from the third decoder so as to generate a plurality of de-interleaved decoded sequences in parallel, and a fourth decoder for performing a same decoding process as performed by the second decoder on the plurality of de-interleaved decoded sequences applied thereto in parallel from the second de-interleaving circuit so as to generate a plurality of output decoded sequences in parallel. The plurality of error-correcting bit sequences used by the first decoder can be transferred to the third decoder in order for the third decoder use them when decoding the plurality of interleaved decoded sequences from the interleaving circuit, and the plurality of error-correcting bit sequences used by the second decoder can be transferred to the fourth decoder in order for the fourth decoder use them when decoding the plurality of de-interleaved decoded sequences from the second de-interleaving circuit.

In accordance with another preferred embodiment of the present invention, the multiple decoding apparatus further comprises an error number estimating circuit for calculating a number of all error bits or symbols corrected by the first and second decoder and assuming the number as a number of errors that have occurred in a transmission medium via which input sequences are transmitted to the multiple decoding apparatus.

In accordance with a further aspect of the present invention, there is provided an information transmission system multiple coding apparatus comprising: a multiple coding apparatus including a first encoder for encoding a plurality of input sequences in parallel so as to generate a plurality of output coded sequences in parallel while adding an error-correcting bit sequence to each of the plurality of input sequences, an interleaving circuit for interleaving a plurality of input sequences that are the plurality of output coded sequences applied thereto in parallel from the first encoder by permuting the plurality of input sequences on a bit-by-bit or symbol-by-symbol basis so as to generate a plurality of interleaved coded sequences in parallel, a second encoder for encoding the plurality of interleaved coded sequences applied thereto in parallel from the interleaving circuit so as to generate a plurality of output coded sequences in parallel while adding an error-correcting bit sequence to each of the plurality of interleaved coded sequences, and an output circuit for sending out the plurality of output coded sequences from the second encoder, as a plurality of concatenated coded sequences, on a transmission medium; and a multiple decoding apparatus including an input circuit for receiving the plurality of concatenated coded sequences from the transmission medium and furnishing the plurality of concatenated coded sequences as a plurality of input sequences, a first decoder for decoding the plurality of input sequences in parallel based on an error-correcting bit sequence included in each of the plurality of input sequences so as to generate a plurality of output decoded sequences in parallel, a de-interleaving circuit for de-interleaving a plurality of input sequences that are the plurality of output decoded sequences applied thereto in parallel from the first decoder by permuting the plurality of output decoded sequences on a bit-by-bit or symbol-by-symbol basis so as to generate a plurality of de-interleaved decoded sequences in parallel such that the plurality of de-interleaved decoded sequences are a same as the corresponding plurality of input sequences before they were interleaved by the interleaving circuit of the multiple coding apparatus, and a second decoder for decoding the plurality of de-interleaved decoded sequences applied thereto in parallel from the de-interleaving circuit based on an error-correcting bit sequence included in each of the plurality of de-interleaved decoded sequences so as to generate a plurality of output decoded sequences in parallel.

Further objects and advantages of the present invention will be apparent from the following description of the preferred embodiments of the invention as illustrated in the accompanying drawings.

DETAILED DESCRIPTION OF THE PREFERRED EMBODIMENTS

Embodiment 1

Figure 1:
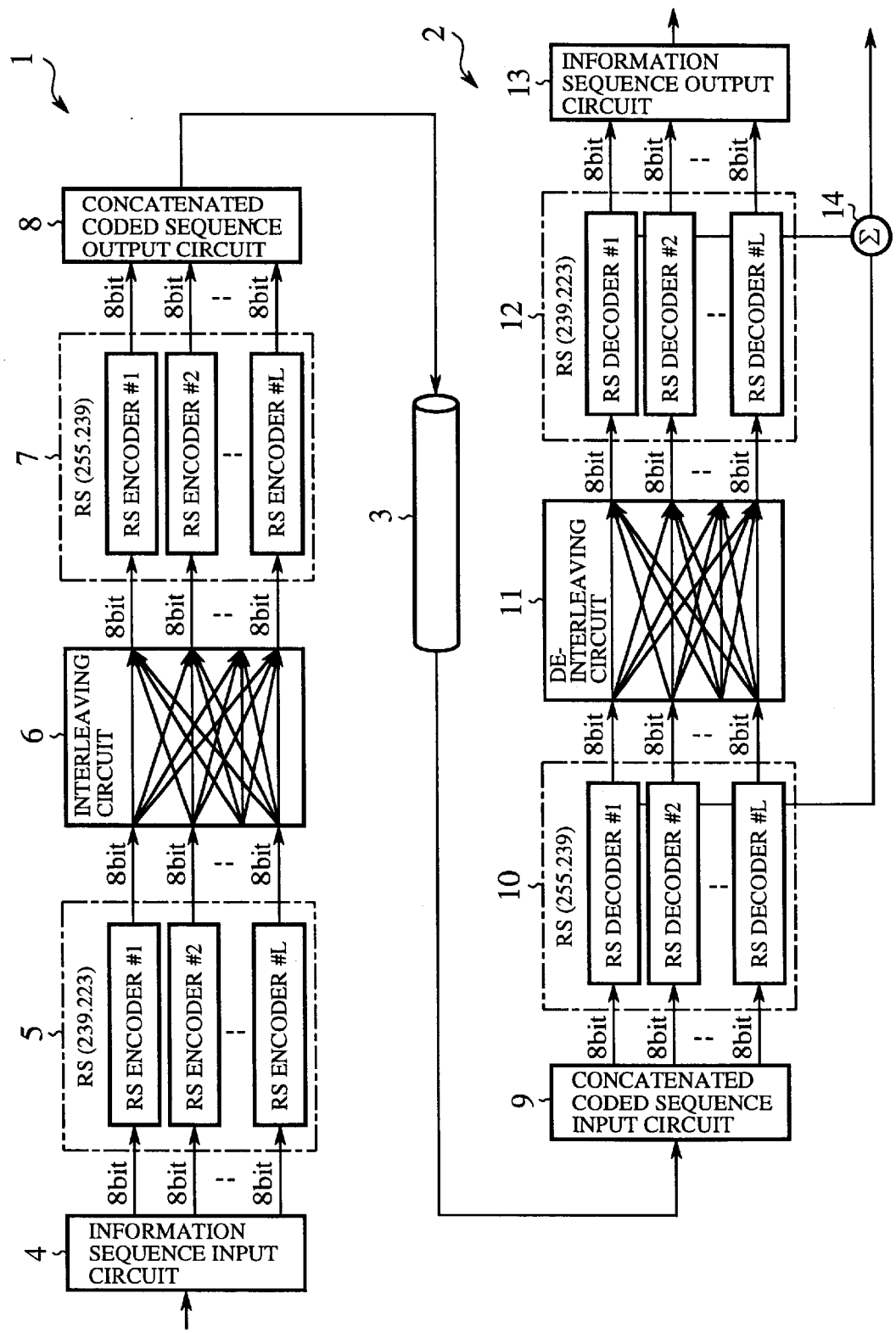
FIG. 1 is a block diagram showing the structure of an information transmission system according to a first embodiment of the present invention.

Referring next to FIG. 1, there is illustrated a block diagram showing the structure of an information transmission system according to a first embodiment of the present invention. In the figure, reference numeral 1 denotes a concatenated coding apparatus that sequentially receives a series of input information sequences, each of which consists of a plurality of information symbols, and generates and furnishes a series of output sequences each comprised of a series of concatenated coded data from the plurality of input information sequences, numeral 2 denotes a concatenated decoding apparatus that receives a series of input sequences each comprised of a series of concatenated coded data, and generates and furnishes a series of output information sequences from the input series of concatenated coded sequences, and numeral 3 denotes a transmission medium, such as an optical fiber, connected between the concatenated coding apparatus 1 and the concatenated decoding apparatus 2, for transmitting the output series of concatenated coded sequences furnished by the concatenated coding apparatus 1, as the input series of concatenated coded sequences, to the concatenated decoding apparatus 2.

The concatenated coding apparatus 1 includes an information sequence input circuit 4 for, every time it receives a new series of L information sequences applied thereto, where L is an integer, and for furnishing the new set of L information sequences at once in parallel to a first coding stage, an outer encoder 5, disposed as the first coding stage, provided with L Reed-Solomon encoders all of which operate in the same way, and each of which simultaneously encodes a corresponding one of the set of L information sequences from the information sequence input circuit 4 and generates an outer coded sequence of the same length, the outer encoder 5 thus generating a set of L outer coded sequences of the same length, an interleaving circuit 6 provided with L input terminals and L output terminals, for interleaving the set of L outer coded sequences from the outer encoder 5 by, every time it receives a new set of L parallel symbols included in the set of L outer coded sequences, permuting the L parallel symbols and then furnishing the permuted L symbols in parallel by changing the L connections between the L input terminals and the L output terminals, so as to generate and furnish a set of L interleaved outer coded sequences to a second coding stage, an inner encoder 7, disposed as the second coding stage, provided with L Reed-Solomon encoders all of which operate in the same way, and each of which simultaneously encodes a corresponding one of the set of interleaved coded sequences applied thereto and generates an inner coded sequence of the same length, the inner encoder 7 thus generating a set of L inner coded sequences of the same length, and a concatenated coded sequence output circuit 8 for sequentially furnishing the set of L inner coded sequences from the inner encoder 7 as a set of L concatenated coded sequences to the transmission medium 3.

The concatenated decoding apparatus 2 includes a concatenated coded sequence input circuit 9 for, every time it receives a new series of L concatenated coded sequences, furnishing the new set of L concatenated coded sequences at once in parallel to a first decoding stage, an inner decoder 10, disposed as the first decoding stage, provided with L Reed-Solomon decoders all of which operate in the same way, and each of which simultaneously decodes a corresponding one of the set of L concatenated coded sequences and generates an inner decoded sequence of the same length, the inner decoder 10 thus generating a set of L inner decoded sequences of the same length, and a de-interleaving circuit 11 provided with L input terminals and L output terminals, for de-interleaving the set of L inner decoded sequences from the inner decoder 10 by, every time it receives a new set of L parallel symbols included in the set of L inner decoded sequences, permuting the L parallel symbols such that they are running in the same order as a corresponding set of L parallel symbols applied to the interleaving circuit of the concatenated coding apparatus 1 by changing the L connections between the L input terminals and the L output terminals, and then furnishing the permuted L symbols in parallel so as to generate and furnish a set of L de-interleaved inner decoded sequences to a second decoding stage. The de-interleaving circuit 11 thus permutes the L inner decoded sequences from the inner decoder 10 on a bit-by-bit or symbol-by-symbol basis such that the L de-interleaved decoded sequences generated in parallel are the same as the corresponding plurality of input sequences before they were interleaved by the interleaving circuit 6 of the multiple coding apparatus 1. The concatenated decoding apparatus 2 further includes an outer decoder 12, disposed as the second decoding stage, provided with L Reed-Solomon decoders all of which operate in the same way, and each of which simultaneously decodes a corresponding one of the set of de-interleaved inner decoded sequences applied thereto and generates an outer decoded sequence of the same length, the outer decoder 12 thus generating a set of L outer decoded sequences of the same length, an information sequence output circuit 13 for sequentially furnishing the set of L outer decoded sequences from the outer decoder 12 as a set of L information sequences, and an error number estimating circuit 14 for calculating the number of all error bits which have been corrected in the whole of the Reed-Solomon decoders and for assuming and furnishing the calculation result as the number of error bits that have occurred in the transmission medium 3.

Figure 2:
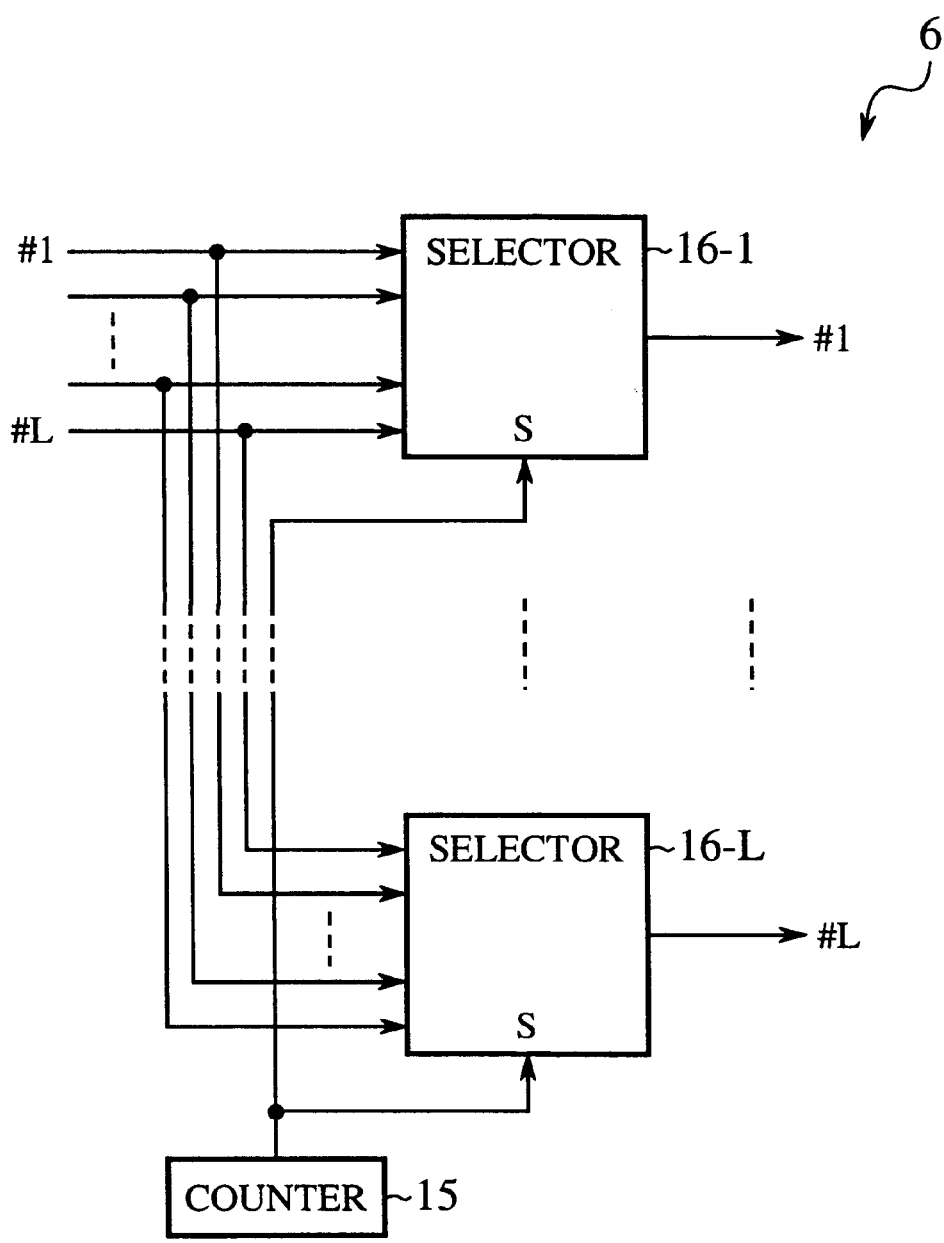
FIG. 2 is a block diagram showing the structure of an interleaving circuit included in a concatenated coding apparatus of the information transmission system in accordance with the first embodiment.

Referring next to FIG. 2, there is illustrated a block diagram showing the structure of the interleaving circuit 6 included in the concatenated coding apparatus 1 in accordance with the first embodiment. As shown in the figure, the interleaving circuit 6 includes a counter 15 for counting symbols included in one outer coded sequence applied to the interleaving circuit 6 from 1 to a given number equal to the total number of symbols included in each outer coded sequence, i.e., the length of each outer coded sequence, and furnishing a select switching signal having a value corresponding to the count value of the counter, and L selectors 16-1 to 16-L each of which receives the set of L outer coded sequences from the outer encoder 5 and, every time it receives a new set of L parallel symbols included in the set of L outer coded sequences, selects a symbol of one outer coded sequence, which is associated with the value of the select switching signal, from the L parallel symbols according to the select switching signal. The interleaving circuit 6 can thus interleave the plurality of outer coded sequences without having to use any memory. The de-interleaving circuit 11 included in the concatenated decoding apparatus 2 has the same structure as the interleaving circuit 6.

In operation, every time a new series of L input information sequences is sequentially applied to the concatenated coding apparatus 1, the information sequence input circuit 4 furnishes the set of L input information sequences to the outer encoder 5 to the outer encoder 5 at once in parallel. The L input information sequences are transmitted symbol by symbol to the L Reed-Solomon encoders of the outer encoder 5, respectively. Every time a new set of L parallel symbols from the information sequence input circuit 4 is input to the outer encoder 5 in parallel, each of the L Reed-Solomon encoders of the outer encoder 5 simultaneously encodes one symbol of a corresponding input information sequence. Each of the L Reed-Solomon encoders finally generates an outer coded sequence including an outer error-correcting bit sequence added to an end thereof. The outer encoder 5 thus furnishes a set of L outer coded sequences to the interleaving circuit 6. Every time the interleaving circuit 6 receives a new set of L parallel symbols included in the set of L outer coded sequences, the counter 15 increments its count value by one and furnishes the incremented count value to the L selectors 16-1 to 16-L. Each of the plurality of selectors selects a symbol of one outer coded sequence from the new set of L symbols according to the new count value of the counter 15 and furnishes the selected symbol as a symbol of a corresponding interleaved coded sequence to the inner encoder 7. Each of the L selectors 16-1 to 16-L is so constructed as to, every time a new set of L parallel symbols of the set of L outer coded sequences is applied to the L selectors, select a different one of the L symbols. Every time a new set of L parallel symbols included in the set of L interleaved coded sequences is input to the inner encoder 7, each of the L Reed-Solomon encoders of the inner encoder 7 further encodes a symbol of a corresponding interleaved coded sequence from the interleaving circuit 6 simultaneously. Each of the L Reed-Solomon encoders of the inner encoder 7 finally generates an inner coded sequence including an outer error-correcting bit sequence added to an end thereof. The inner encoder 7 thus furnishes a set of L inner coded sequences to the concatenated coded sequence output circuit 8. Then the concatenated coded sequence output circuit 8 sequentially sends out the set of L inner coded sequences as a set of concatenated coded sequences on the transmission medium 3.

Every time the concatenated coded sequence input circuit 9 of the concatenated decoding apparatus 2 sequentially receives a new series of L concatenated coded sequences from the transmission medium 3, the concatenated coded sequence input circuit 9 furnishes the new set of L input concatenated coded sequences to the inner decoder 10 at once in parallel. The L concatenated coded sequences are transmitted symbol by symbol to the L Reed-Solomon decoders of the inner decoder 10, respectively. Every time a new set of L parallel symbols is input to the inner decoder 10, each of the L Reed-Solomon decoders of the inner decoder 10 simultaneously decodes a symbol of a corresponding input concatenated coded sequence from the concatenated coded sequence input circuit 9. Each of the L Reed-Solomon decoders of the inner decoder 10 corrects one or more error bits using the inner error-correcting bit sequence included in the corresponding input concatenated coded sequence when needed so as to generate an inner decoded sequence. The inner decoder 10 thus furnishes a set of L inner decoded sequences to the de-interleaving circuit 11. If no error occurs in the concatenated coded sequences transmitted via the transmission line 3, the set of L inner decoded sequences is the same as the corresponding set of L interleaved coded sequences output from the interleaving circuit 6 of the concatenated coding apparatus 1. Every time the de-interleaving circuit 11 receives a new set of L parallel symbols, the counter 15 increments its count value by one and furnishes the incremented count value to the L selectors 16-1 to 16-L. Each of the plurality of selectors selects a symbol of one inner decoded sequence from the new set of L parallel symbols according to the new count value of the counter 15 and furnishes the selected symbol as a symbol of a corresponding de-interleaved decoded sequence to the outer decoder 12. Each of the L selectors 16-1 to 16-L is so constructed as to, every time a new set of L parallel symbols of the set of L inner decoded sequences is applied to the L selectors, select a different one of the L symbols. If no error occurs in the concatenated coded sequences transmitted via the transmission line 3, the set of L de-interleaved decoded sequences is the same as the corresponding set of L outer coded sequences output from the outer encoder 5 of the concatenated coding apparatus 1. Every time a new set of L parallel symbols of the set of L de-interleaved decoded sequences is input to the outer decoder 12, each of the L Reed-Solomon encoders of the outer decoder 12 further decodes a symbol of a corresponding de-interleaved decoded sequence from the de-interleaving circuit 11 simultaneously. Each of the L Reed-Solomon encoders of the outer decoder 12 corrects one or more error bits using the outer error-correcting bit sequence added to an end of the corresponding de-interleaved decoded sequence when needed so as to generate an outer decoded sequence. The outer decoder 12 thus furnishes a set of L outer decoded sequences to the information sequence output circuit 13. If no error occurs in the concatenated coded sequences transmitted via the transmission line 3, the set of L outer decoded sequences is the same as the corresponding set of L input information sequences input to the outer encoder 5 of the concatenated coding apparatus 1 in parallel. The information sequence output circuit 13 then furnishes the set of L outer decoded sequences as a set of L output information sequences to outside the system.

The error number estimating circuit 14 calculates the number of all error bits which have been corrected in the whole of all the Reed-Solomon decoders. The error number estimating circuit 14 then assumes and furnishes the number of all corrected error bits as the error number of all errors that have occurred in the transmission medium 3. The error number therefore indicates the transmission status of the transmission medium 3. For example, the amplification factor of a receive amplifier disposed in a receiver for receiving information by way of the transmission medium can be optimized using the error number.

Figure 3A:
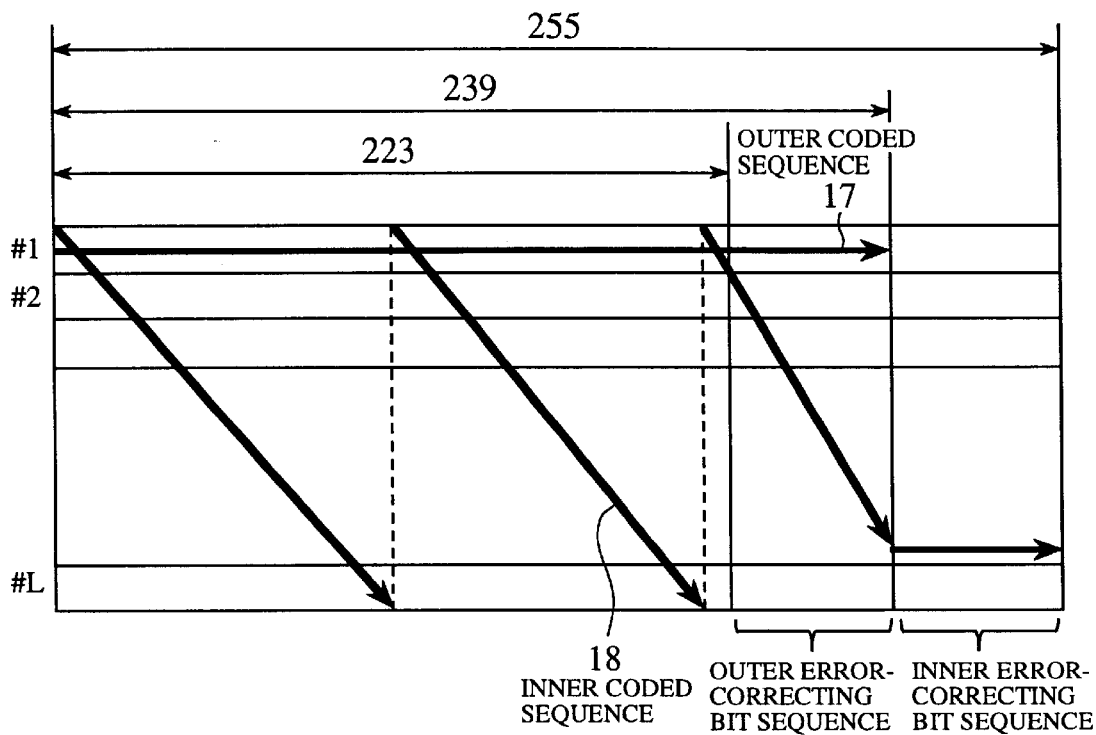
FIG. 3(a) is a format diagram for explaining in detail a concatenated coding processing performed by the information transmission system according to the first embodiment of the present invention when viewed from a plurality of input sequences applied to the information transmission system.

Referring next to FIG. 3 (a), there is illustrated a format diagram for explaining the concatenated coding process performed by the information transmission system according to the first embodiment of the present invention in detail. In the figure, a plurality of input information sequences to be simultaneously processed by the concatenated coding apparatus are designated by #1 to #L, respectively. As shown in FIG. 3(a), each of the plurality of input information sequences #1 to #L has 223 symbols, and a 16-symbol (from 224th symbol to 239th symbol) outer error-correcting bit sequence is added to an end of each of the plurality of input information sequences outer-coded, i.e., outer coded sequences. Furthermore, a 16-symbol (from 240th symbol to 255th symbol) inner error-correcting bit sequence is added to an end of each of the plurality of inner coded sequences, as can be seen from FIG. 3(a). In other words, each of the plurality of outer coded sequences is a Reed-Solomon code of 239-byte length including information of 223-byte length, and each of the plurality of inner coded sequences is a Reed-Solomon code of 255-byte length including information of 239-byte length. As previously mentioned, the plurality of Reed-Solomon encoders within the outer encoder 5 receive the plurality of input information sequences #1 to #L, just as they are, and generate the plurality of outer coded sequences each including an outer error-correcting bit sequence added to an end thereof, respectively. The arrow 17 of FIG. 3(a) designates one of the plurality of outer coded sequences generated by the outer encoder 5. The interleaving circuit 6 interleaves the plurality of outer coded sequences by permuting L parallel symbols of each of a plurality of sets included in the plurality of outer coded sequences and furnishing the permuted L parallel symbols in parallel so as to generate a plurality of interleaved coded sequences, as previously mentioned. The plurality of Reed-Solomon encoders within the inner encoder 7 then receive the plurality of interleaved coded sequences, and generate the plurality of inner coded sequences each having an inner error-correcting bit sequence added to an end thereof, respectively. The arrow 18 of FIG. 3(a) designates one of the plurality of inner coded sequences generated by the inner encoder 7. As can be seen from FIG. 3(a), the direction of the outer encoding differs from that of the inner encoding.

Figure 3B:
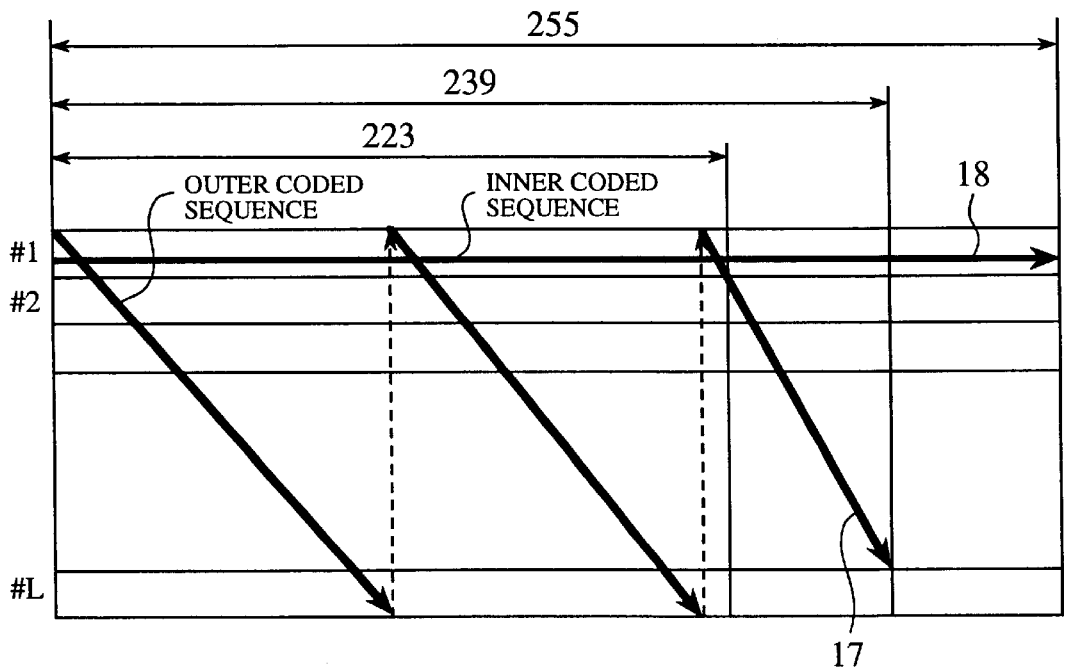
FIG. 3(b) is a format diagram for explaining in detail the same concatenated coding processing as shown in FIG. 3(b) when viewed from a plurality of concatenated coded sequences to be sent out on a transmission medium.

Referring next to FIG. 3(b), there is illustrated a format diagram showing the same concatenated coding process as shown in FIG. 3(a) when viewed from the plurality of output concatenated coded sequences to be sent out on the transmission medium 3. The plurality of horizontal rows #1 to #L of FIG. 3(b) respectively corresponding to the plurality of output concatenated coded sequences can be sequentially sent out on the transmission medium 3 row by row. In this case, while all symbols included in each of the plurality of inner coded sequences continuously reside on the transmission medium 3, all symbols included in each of the plurality of outer coded sequences, such as symbols of each of the plurality of input information sequences and symbols of each of the plurality of outer error-correcting bit sequences, discretely reside on the transmission medium 3. This means that it is possible to perform error detection and correction on single bit errors and burst errors.

As previously mentioned, the counter 16 of the interleaving circuit 6 counts symbols of one input sequence applied thereto from 1 to a given number equal to the total number of symbols of each input sequence, i.e., the length of each input sequence. Each of the L selectors of the interleaving circuit 6 selects the same input sequence applied to the same input terminal every time it performs the selection a predetermined number of times corresponding to the number of the plurality of input sequences applied thereto, i.e., L. To this end, the counter 16 generates a select switching signal having a value equal to that of the three lowermost bits of its count value, for example. In this case, L is 8. Similarly, the counter 16 of the de-interleaving circuit 11 counts symbols of one input sequence applied thereto from 1 to a given number equal to the total number of symbols of each input sequence, i.e., the length of each input sequence, and each of the L selectors of the de-interleaving circuit 11 selects the same input sequence applied to the same input terminal every time it performs the selection a predetermined number of times corresponding to the number of the plurality of input sequences applied thereto, i.e., L.

As previously mentioned, in accordance with the first embodiment of the present invention, the information transmission apparatus comprises the outer encoder 5 for encoding a set of L input information sequences at once in parallel while adding an error-correcting bit sequence to each of the L input information sequences so as to generate a set of L outer coded sequences, the interleaving circuit 6 for interleaving the set of L outer coded sequences by, every time it receives a new set of L parallel symbols included in the set of L outer coded sequences, permuting the L parallel symbols and furnishing the permuted L symbols in parallel so as to generate a set of L interleaved coded sequences, and the inner encoder 7 for encoding the set of L interleaved coded sequences at once in parallel while adding an error-correcting bit sequence to each of the L interleaved coded sequences so as to generate a set of L inner coded sequences. The information transmission apparatus can thus perform the error-correcting code addition process on a plurality of input information sequences in parallel two times using the outer encoder 5 and the inner encoder 7, and perform the interleaving process on a plurality of outer coded sequences generated in the first encoding stage during the interval between the first and second encoding stages using the interleaving circuit 6, so as to generate a plurality of concatenated coded sequences. Accordingly, the ability of the outer encoder 5 is multiplied by a factor of L. Similarly, the ability of the inner encoder 7 is multiplied by a factor of L.

In addition, the information transmission apparatus can directly transmit the set of L outer coded sequences from the outer encoder 5 to the inner encoder 7 without temporarily storing the set of L outer coded sequences in an interleaving memory, thus decreasing the time delay caused by the concatenated coding processing by a large amount and therefore extensively improving the information transmission rate compared with prior art information transmission apparatuses that sequentially store the set of L outer coded sequences in an interleaving memory and, after that, sequentially read them from the interleaving memory. As a result, the total delay caused by the multiple coding is decreased by a large amount. Furthermore, no memory is needed for the interleaving process. In other words, the interleaving process performed during the interval between the two encoding processes without an additional interleaving memory can reduce the total delay due to the multiple coding and the amount of memory used during the multiple coding by a large amount while ensuring the reliability of information transmitted, thus providing a high information transmission rate which any prior art information apparatus could not offer.

The number of coded sequences that can be simultaneously processed in parallel by any one of the outer encoder 5, the inner encoder 7, and the interleaving circuit 6 is uniformly L. Accordingly, the present embodiment cannot cause a bottleneck in the information transmission rate, unlike a case where the number of coded sequences to be processed in parallel is decreased in either one of the outer encoder 5, the inner encoder 7, and the interleaving circuit 6. The present embodiment can thus improve the system throughput during the two-stage coding process up to at least L times those of prior art information transmission apparatuses, thus providing a very-high coding process speed that is a few times those of prior art information transmission apparatuses.

In addition, the interleaving circuit 6 includes the counter 15 for counting symbols included in one outer coded sequence applied thereto, and the L selectors 16-1 to 16-L each of which receives the set of L outer coded sequences from the outer encoder 5 and, every time it receives a new set of L parallel symbols included in the set of L outer coded sequences, selects a symbol of one outer coded sequence from the L parallel symbols according to the count value of the counter 15, so as to generate a set of L interleaved coded sequences. Accordingly, the inner encoder 7 can encode the set of L interleaved coded sequences applied thereto on a block-by-block basis, where the length of each block is equal to that of each outer coded sequence.

As previously mentioned, each of the L selectors 16-1 to 16-L of the interleaving circuit selects one outer coded sequence from the L outer coded sequences on a symbol-by-symbol basis every time a new set of L parallel symbols is applied thereto in such a manner that each of the L selectors selects a symbol applied to the same input terminal thereof every time it performs the symbol selection L times. Thus the interleaving circuit 6 periodically repeats the same process of block-interleaving the set of L outer coded sequences on a block-by-block basis, where each block consists L symbols, by using the L selectors.

In accordance with the first embodiment, each of the outer and inner encoders 5 and 7 can encode each of a plurality of input sequences on a symbol-by-symbol (or byte-by-byte) basis after adding an error-correcting coded sequence to each of the plurality of input sequences to be encoded using a Reed-Solomon coding method. Accordingly, the present embodiment offers an advantage of being able to simplify the structure of the concatenated coding apparatus of the information transmission system as compared with a case where an error-checking bit sequence is added to each of the plurality of input sequences using a Bose-Chaudhuri-Hocquenghe or BCH coding method or the like, and to process the plurality of input sequences in parallel with a high degree of efficiency.

As previously mentioned, in accordance with the first embodiment of the present invention, the information transmission apparatus comprises the inner decoder 10 for decoding a set of L input information sequences at once in parallel using an error-correcting bit sequence included in each of the L input information sequences so as to generate a set of L inner decoded sequences, the de-interleaving circuit 11 for de-interleaving the set of L inner decoded sequences by, every time it receives a new set of L parallel symbols included in the set of L inner decoded sequences, permuting the L parallel symbols and furnishing the permuted L symbols in parallel so as to generate a set of L de-interleaved decoded sequences, and the outer decoder 12 for decoding the set of L de-interleaved decoded sequences at once in parallel using an error-correcting bit sequence included in each of the L de-interleaved decoded sequences so as to generate a set of L inner decoded sequences. The information transmission apparatus can thus perform the decoding process on a plurality of input information sequences in parallel two times using the inner decoder 10 and the outer decoder 12, and perform the de-interleaving process on a plurality of inner decoded sequences generated in the first decoding stage during the interval between the first and second decoding stages using the de-interleaving circuit 11, so as to generate a plurality of concatenated decoded sequences. Accordingly, the ability of the inner decoder 10 is multiplied by a factor of L. Similarly, the ability of the outer decoder 12 is multiplied by a factor of L.

In addition, the information transmission apparatus can directly transmit the set of L inner decoded sequences from the inner decoder 10 to the outer decoder 12 without temporarily storing the set of L inner decoded sequences in a de-interleaving memory, thus decreasing the time delay caused by the concatenated decoding processing by a large amount and therefore extensively improving the information transmission rate compared with prior art information transmission apparatuses that sequentially store the set of L inner decoded sequences in a de-interleaving memory and, after that, sequentially read them from the de-interleaving memory. As a result, the total delay caused by the multiple decoding is decreased by a large amount. Furthermore, no memory is needed for the de-interleaving process. In other words, the de-interleaving process performed during the interval between the two decoding processes without having to use an additional de-interleaving memory can reduce the total delay due to the multiple decoding and the amount of memory used during the multiple decoding by a large amount while ensuring the reliability of information received, thus providing a high information transmission rate which any prior art information apparatus could not offer.

The number of input sequences that can be simultaneously processed in parallel by any one of the inner decoder 10, the de-interleaving circuit 11, and the outer decoder 12 is uniformly L. Accordingly, the present embodiment cannot cause a bottleneck in the information transmission rate, unlike a case where the number of input sequences to be processed in parallel is decreased in either one of the inner decoder 10, the de-interleaving circuit 11, and the outer decoder 12. The present embodiment can thus improve the system throughput during the two-stage decoding processing up to at least L times those of prior art information transmission apparatuses, thus providing a very-high decoding process speed that is a few times those of prior art information transmission apparatuses.

In addition, the de-interleaving circuit 11 includes the counter 15 for counting symbols included in one inner decoded sequence applied thereto, and the L selectors 16-1 to 16-L each of which receives the set of L inner decoded sequences from the inner decoder 10 and, every time it receives a new set of L parallel symbols included in the set of L inner decoded sequences, selects a symbol of one inner decoded sequence from the L parallel symbols according to the count value of the counter 15, so as to generate a set of L de-interleaved decoded sequences. Accordingly, the outer decoder 12 can encode the set of L de-interleaved decoded sequences applied thereto on a block-by-block basis, where the length of each block is equal to that of each inner decoded sequence.

As previously mentioned, each of the L selectors 16-1 to 16-L of the de-interleaving circuit selects one inner decoded sequence from the L inner decoded sequences on a symbol-by-symbol basis every time a new set of L parallel symbols is applied thereto in such a manner that each of the L selectors selects a symbol applied to the same input terminal thereof every time it performs the symbol selection L times. Thus the de-interleaving circuit 11 periodically repeats the same process of block-de-interleaving the set of L inner decoded sequences on a block-by-block basis, where each block consists L symbols, by using the L selectors.

In accordance with the first embodiment, each of the outer and outer decoders 10 and 12 can decode each of a plurality of input sequences on a symbol-by-symbol (or byte-by-byte) basis using a Reed-Solomon coding method. Accordingly, the present embodiment offers an advantage of being able to simplify the structure of the concatenated decoding apparatus of the information transmission system as compared with a case where the plurality of input sequences are decoded using a Bose-Chaudhuri-Hocquenghe or BCH code or the like, and to process the plurality of input sequences in parallel with a high degree of efficiency.

Numerous variants may be made in the exemplary embodiment shown. For example, the concatenated coding apparatus 1 can perform the concatenated coding processing on a bit-by-bit basis, instead of performing the concatenated coding processing on a symbol-by-symbol basis as mentioned above. In this case, the concatenated decoding apparatus 2 performs the concatenated decoding processing on a bit-by-bit basis too. In either of the interleaving circuit 6 and the de-interleaving circuit 11, the counter 15 counts bits of one input sequence from 1 to the total number of each input sequence. In another variant, the concatenated coding apparatus further includes one or more additional encoders and one or more additional interleaving circuits disposed between any two adjacent encoders. The variant can further improve the reliability of information transmitted. In this case, the concatenated decoding apparatus 2 has to further include one or more corresponding decoders and one or more corresponding de-interleaving circuits disposed between any two adjacent decoders.

Embodiment 2

Figure 4:
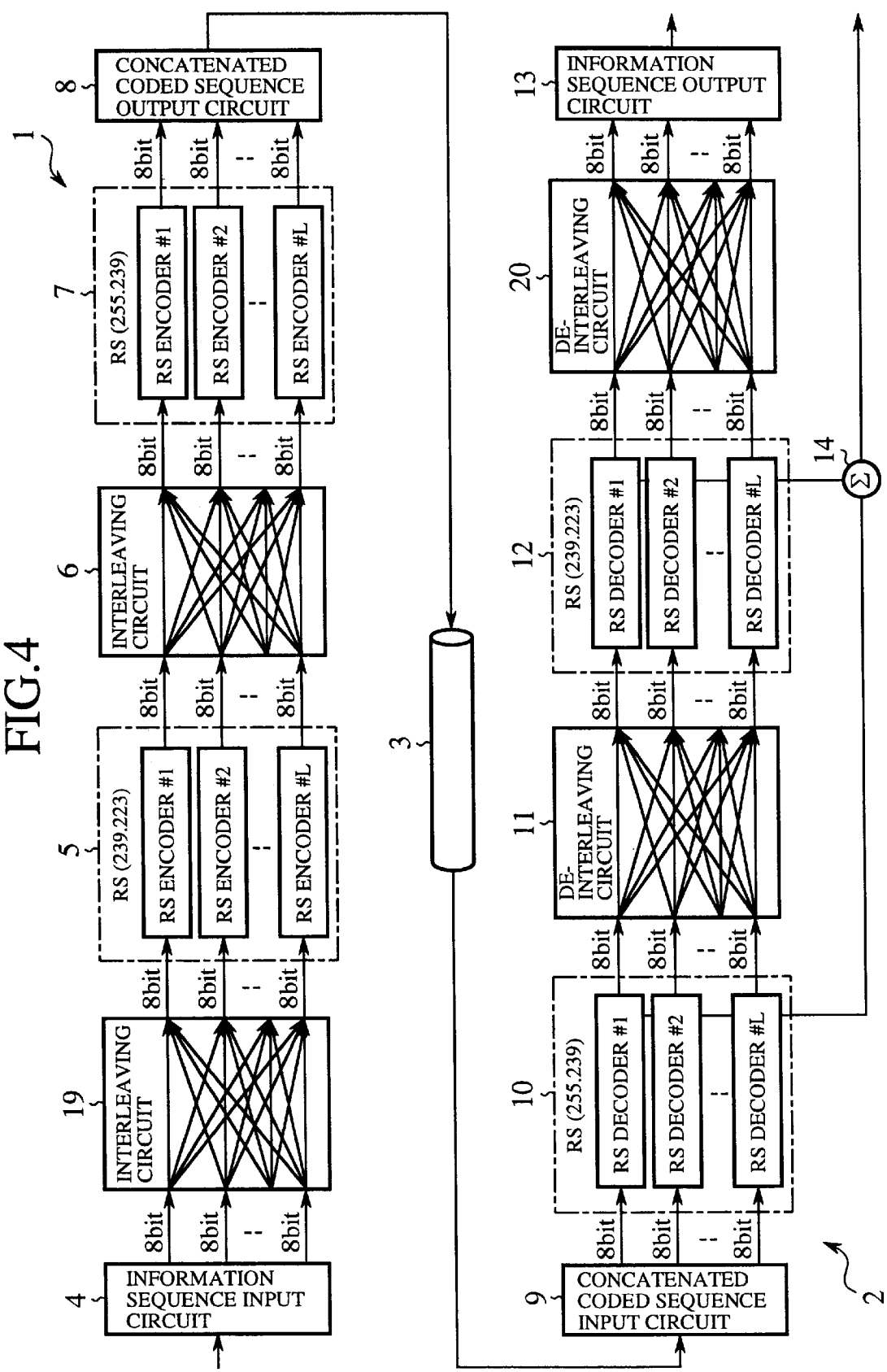
FIG. 4 is a block diagram showing the structure of an information transmission system according to a second embodiment of the present invention.

Referring next to FIG. 4, there is illustrated a block diagram showing the structure of an information transmission system according to a second embodiment of the present invention. In the figure, the same reference numerals as shown in FIG. 1 denote the same components as of the information transmission system according to the above-mentioned first embodiment, and therefore the description of those components will be omitted hereinafter. In FIG. 4, reference numeral 19 denotes an interleaving circuit disposed between an information sequence input circuit 4 and an outer encoder 5 of a concatenated coding apparatus 1, and provided with L input units and L output units, for interleaving a set of L input sequences from the information sequence input circuit 4 by, every time it receives a new set of L parallel symbols included in the set of L input sequences, permuting the L parallel symbols and then furnishing the permuted L symbols in parallel by changing the L connections between the L input terminals and the L output terminals, so as to generate and furnish a set of L interleaved information sequences to a first coding stage. The L interleaved information sequences are applied to an outer encoder 5 disposed as the first coding stage. In addition, reference numeral 20 denotes a de-interleaving circuit disposed between an outer decoder 12 and an information sequence output circuit 13 of a concatenated decoding apparatus 2, and provided with L input units and L output units, for de-interleaving a set of L outer decoded sequences by, every time it receives a new set of L parallel symbols included in the set of L outer decoded sequences, permuting the L parallel symbols and then furnishing the permuted L symbols in parallel by changing the L connections between the L input terminals and the L output terminals, so as to generate L sequences of de-interleaved decoded information. The L de-interleaved decoded information sequences are applied to the information sequence output circuit 13. Each of the interleaving and de-interleaving circuits 19 and 20 has the same structure as shown in FIG. 2.

In operation, every time the information sequence input circuit 4 furnishes a set of L input information sequences at once in parallel symbol-by-symbol to the interleaving circuit 19, a counter 15 of the interleaving circuit 19 increments its count value by one and furnishes the incremented count value to L selectors 16-1 to 16-L. Each of the plurality of selectors selects one input information sequence from the L information sequences according to the new count value of the counter 15 symbol by symbol and furnishes the selected input information sequence as an interleaved information sequence to the outer encoder 5. Each of the L selectors 16-1 to 16-L is so constructed as to, every time a new set of L symbols is applied to each of the L selectors, select a different one of the L symbols.

When the outer decoder 12 furnishes a set of L outer decoded sequences to the de-interleaving circuit 20, the counter 15 of the de-interleaving circuit 20 increments its count value by one and furnishes the incremented count value to the L selectors 16-1 to 16-L every time a new set of L symbols is applied to the de-interleaving circuit 20. Each of the plurality of selectors selects one outer decoded sequence from the L outer decoded sequences according to the new count value of the counter 15 symbol by symbol and furnishes the selected outer decoded sequence as a de-interleaved decoded information sequence to the information sequence output circuit 13. Each of the L selectors 16-1 to 16-L is so constructed as to, every time a new set of L symbols is applied to each of the L selectors, select a different one of the L symbols. If no error occurs in the concatenated coded sequences transmitted via the transmission line 3, the L de-interleaved decoded sequences are the same as the L input information sequences applied to the interleaving circuit 19 of the concatenated coding apparatus 1, respectively. With the exception of the interleaving circuit 19 and the de-interleaving circuit 20, the information transmission system in accordance with the second embodiment of the present invention operates in the same way that the information transmission system of the above-mentioned first embodiment does, and therefore the description of the operation of the other components will be omitted hereinafter.

The second embodiment can thus go beyond making the direction of the outer coding differ from that of the inner coding and get into defining them freely with respect to a set of input information sequences to be encoded. The direction of the outer coding can be orthogonal to that of the inner coding, for example. In this case, error corrections can be made as in a conventional case of using an interleaving memory.

Embodiment 3

Figure 5:
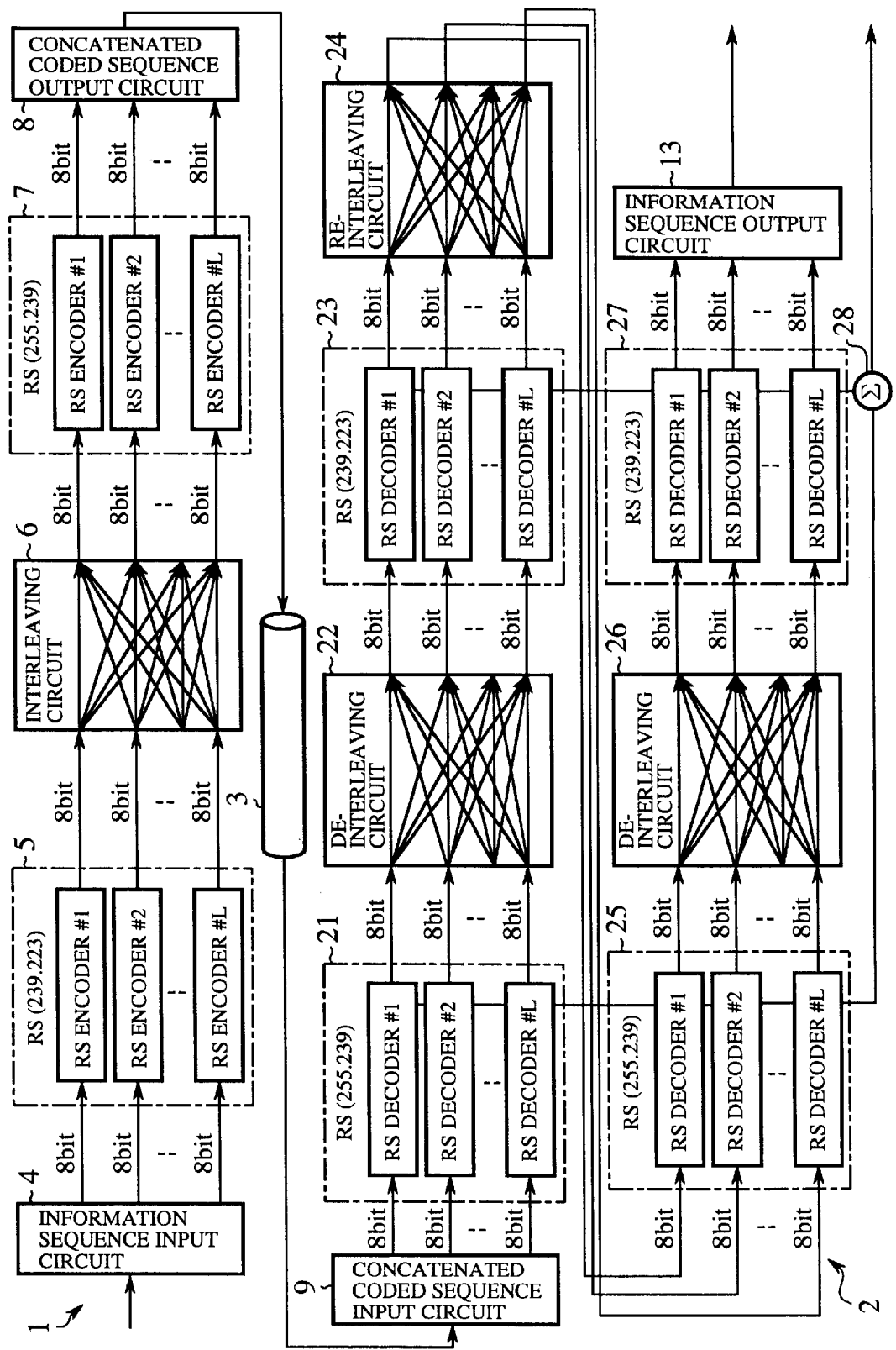
FIG. 5 is a block diagram showing the structure of an information transmission system according to a third embodiment of the present invention.
Figure 6:
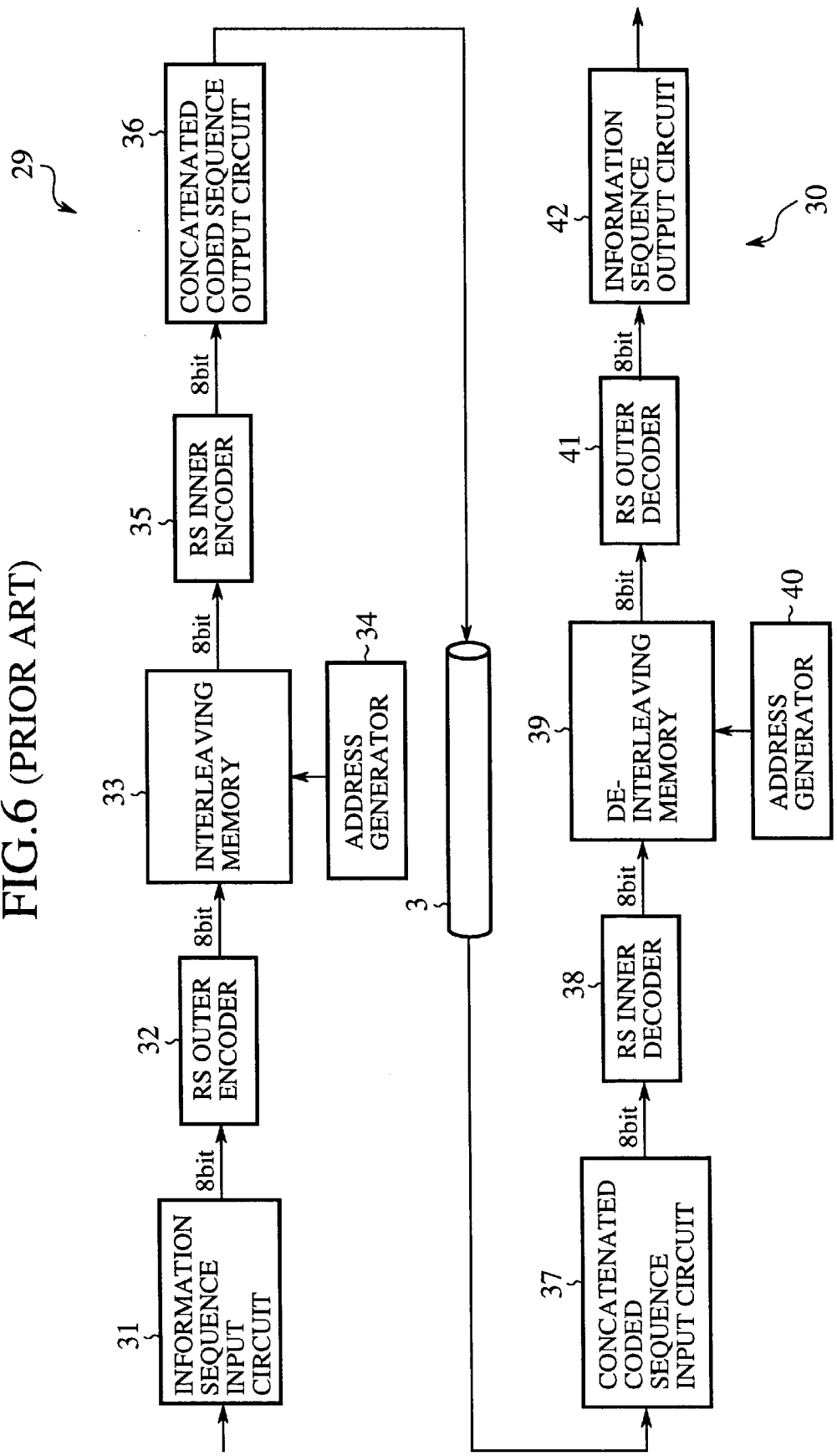
FIG. 6 is a block diagram showing the structure of a prior art information transmission system.
Figure 7:
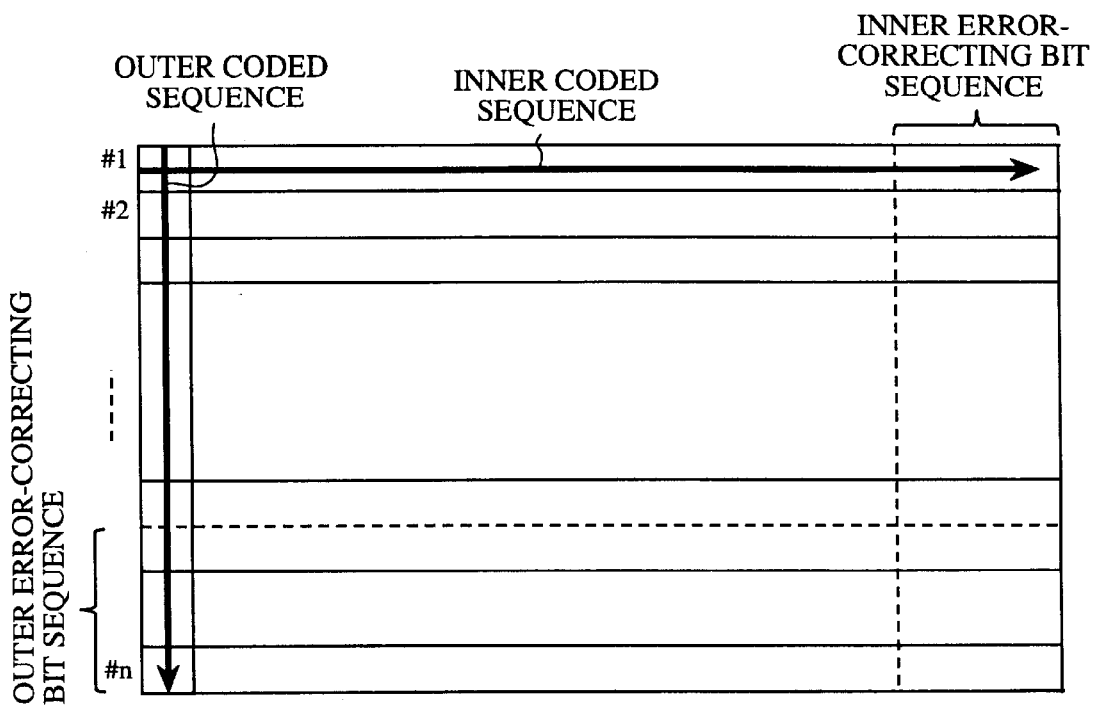
FIG. 7 is a format diagram for explaining writing and reading operations of an interleaving memory of the prior art information transmission system of FIG. 6.
Figure 8:
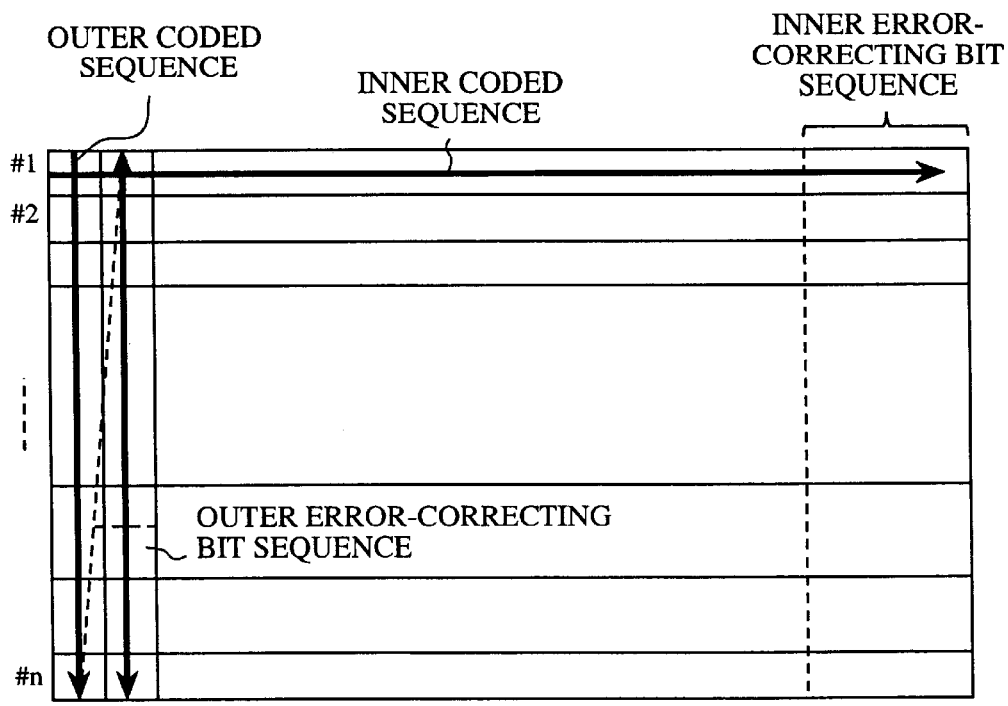
FIG. 8 is a format diagram for explaining an example in which a plurality of outer coded sequences are written into the interleaving memory of the prior art information transmission system of FIG. 6 such that each of them is split across some columns.

Referring next to FIG. 5, there is illustrated a block diagram showing the structure of an information transmission system according to a third embodiment of the present invention. In the figure, the same reference numerals as shown in FIG. 1 denote the same components as of the information transmission system according to the above-mentioned first embodiment of the present invention, and therefore the description of those components will be omitted hereinafter. In accordance with the third embodiment, a multiple decoding apparatus 2 includes a first inner decoder 21 for performing the same decoding process as the inner decoder 10 of the first embodiment on a set of input sequences using a plurality of inner error-correcting bit sequences respectively included in the plurality of input sequences so as to generate a set of inner decoded sequences, and for furnishing the plurality of inner error-correcting bit sequences, a first de-interleaving circuit 22 for performing the same de-interleaving process as the de-interleaving circuit 11 of the first embodiment on the set of inner decoded sequences so as to generate a set of de-interleaved decoded sequences and for allowing the set of inner error-correcting bit sequences from the first inner decoder 21 to pass therethrough, a first outer decoder 23 for performing the same decoding process as the outer decoder 12 of the first embodiment on the set of de-interleaved decoded sequences from the first de-interleaving circuit 22 using a plurality of outer error-correcting bit sequences respectively included in the plurality of de-interleaved decoded sequences so as to generate a set of outer decoded sequences, and for furnishing the plurality of outer error-correcting bit sequences as well as the plurality of inner error-correcting bit sequences, a re-interleaving circuit 24 for performing the same interleaving process as the interleaving circuit 6 of the concatenated coding apparatus of the first embodiment on the set of outer decoded sequences and the set of outer error-correcting bit sequences from the first outer decoder 23 so as to generate a set of re-interleaved coded sequences, and for allowing the set of inner error-correcting bit sequences from the first inner decoder 21 to pass therethrough, a second inner decoder 25 for performing the same decoding process as the first inner decoder 21 on the set of re-interleaved coded sequences using the plurality of inner error-correcting bit sequences transferred thereto from the first inner decoder 21 so as to regenerate a set of inner decoded sequences, a second de-interleaving circuit 26 for performing the same de-interleaving process as the first de-interleaving circuit 22 on the set of regenerated inner decoded sequences so as to regenerate a set of de-interleaved decoded sequences, a second outer decoder 27 for performing the same decoding process as the first outer decoder 23 on the set of regenerated de-interleaved decoded sequences using the plurality of outer error-correcting bit sequences so as to regenerate a set of outer decoded sequences, and for furnishing the plurality of regenerated outer decoded sequences to an information sequence output circuit 13, and an error number estimating circuit 28 for calculating the number of all error bits corrected in the whole of all the Reed-Solomon decoders and assuming the calculated number as the number of errors that have occurred in a transmission medium 3 via which input sequences are transmitted to the multiple decoding apparatus 2.

In operation, when the first inner decoder 21 receives a plurality of input concatenated coded sequences applied thereto in parallel from a concatenated coded sequence input circuit 9, the first inner decoder 21 decodes the set of input concatenated coded sequences in parallel using a plurality of inner error-correcting bit sequences respectively included in the plurality of input concatenated coded sequences so as to generate a set of inner decoded sequences, and furnishes the set of inner decoded sequences as well as the plurality of inner error-correcting bit sequences to the first de-interleaving circuit 22. The first de-interleaving circuit 22 de-interleaves the set of inner decoded sequences to generate a plurality of de-interleaved decoded sequences and allows the set of inner error-correcting bit sequences to pass therethrough. The first outer decoder 23 then decodes the set of de-interleaved decoded sequences in parallel using a plurality of outer error-correcting bit sequences respectively included in the plurality of de-interleaved decoded sequences so as to generate a set of outer decoded sequences, and furnishes the set of outer decoded sequences as well as the set of outer error-correcting bit sequences to the re-interleaving circuit 24. If no error occurs in the transmission medium 3, the set of outer decoded sequences can be assumed to be the same as a corresponding set of input information sequences coded by a concatenated coding apparatus 1.

The re-interleaving circuit 24 interleaves the set of outer decoded sequences and the set of outer error-correcting bit sequences again so as to regenerate a set of re-interleaved coded sequences and allows the set of inner error-correcting bit sequences to pass therethrough. The second inner decoder 25 then decodes the set of re-interleaved coded sequences using the plurality of inner error-correcting bit sequences transferred thereto from the first inner decoder 21 so as to regenerate a set of inner decoded sequences. The second de-interleaving circuit 26 de-interleaves the set of regenerated inner decoded sequences from the second inner decoder 25 so as to regenerate a set of de-interleaved decoded sequences, and the second outer decoder 27 then decodes the set of regenerated de-interleaved decoded sequences using the plurality of outer error-correcting bit sequences so as to regenerate a set of outer decoded sequences, and for furnishing the plurality of regenerated outer decoded sequences to the information sequence output circuit 13. If no error occurs in the transmission medium 3, those sets of sequences generated during the re-interleaving, second inner decoding, second de-interleaving, and second outer decoding processes can be assumed to be the same as the corresponding sets of sequences applied to the first inner decoder and generated during the first inner decoding, first de-interleaving, and first outer decoding processes mentioned above. Although the first inner and outer decoding processes result in the correction of some bit errors, the first outer decoding process can yield a result to cause the first inner decoding process to yield an improper result. The second inner decoding process makes it possible to correct such an improper result and to generate a set of more proper inner decoded sequences.

In the above-mentioned arrangement of the third embodiment, the plurality of inner error-correcting bit sequences used by the first inner decoder 21 are transferred to the second inner decoder 25 in order for the second inner decoder 25 to use the plurality of inner error-correcting bit sequences to correct bit errors for the second time. Similarly, the plurality of outer error-correcting bit sequences used by the first outer decoder 23 are transferred to the second outer decoder 27 in order for the second outer decoder 27 to use the plurality of outer error-correcting bit sequences to correct bit errors for the second time. Therefore, the repeated outer and inner decoding processes can generate a set of more proper and reliable information sequences even when the first outer and inner decoding processing cannot correct all error bits that have occurred in the set of input concatenated coded sequences perfectly.

The plurality of inner error-correcting bit sequences can also be interleaved by the re-interleaving circuit 24, instead of being allowed to pass through the re-interleaving circuit 24. In either case, it is essential only that the plurality of inner error-correcting bit sequences be a properly reproduced one when the second inner decoder 25 uses them. Similarly, it is essential only that the plurality of outer error-correcting bit sequences be a properly-reproduced one when the second outer decoder 27 uses them. Especially, if the re-interleaving circuit 24 interleaves the plurality of outer decoded sequences by permuting them in reverse order to how the de-interleaving circuit 22 permuted the plurality of inner decoded sequences, the plurality of outer error-correcting bit sequences and the plurality of inner error-correcting bit sequences can be properly transferred to the second outer decoder 27 and the second inner decoder 25 without having to incorporate the function of allowing the plurality of inner error-correcting bit sequences to pass therethrough into the re-interleaving circuit 24 and so forth, respectively.

As previously mentioned, in accordance with the third embodiment of the present invention, the concatenated decoding apparatus 2 further includes the re-interleaving circuit 24, the second inner decoder 25, the second de-interleaving circuit 26, and the second outer decoder 27, which are disposed behind the first outer decoder 23, and transfers the plurality of inner error-correcting bit sequences from the first inner decoder 21 to the second inner decoder 25 and also transfers the plurality of outer error-correcting bit sequences from the first outer decoder 23 to the second outer decoder 27. Accordingly, even when the first outer decoding process can yield a result to cause the first inner decoding process to yield an improper result, or even when the second inner decoding process can yield a result to cause the second outer decoding process to yield an improper result, the second inner or outer decoder 25 or 27 can correct such an improper result so as to generate a set of more proper inner decoded sequences. The third embodiment thus offers an advantage of being able to further improve the reliability of information received.

In accordance with the third embodiment of the present invention, the concatenated decoding apparatus 2 further includes the error number estimating circuit 28 that calculates the number of all error bits corrected by the first and second inner decoders 21 and 25 and the first and second outer decoders 23 and 27, and assumes the calculated number as the number of errors that have occurred in the transmission medium 3, and each of the second inner and outer decoders 25 and 27 corrects error bits when needed. Accordingly, the concatenated decoding apparatus 2 can detect and correct all bit errors included in the plurality of concatenated coded sequences with a high degree of accuracy.

Numerous variants may be made in the exemplary embodiments shown. A combination of two Reed-Solomon codes is used as an example in all the concatenated coding and decoding arrangements of the above-mentioned embodiments. As an alternative, BCH code, block code, or convolution code of a limited length can be used. A varying combination of two or more of those codes can be used in the concatenated coding and decoding arrangement. In addition, the concatenated coding apparatus according to the present invention can include an arbitrary number of coding stages, as previously mentioned.

As previously mentioned, the concatenated decoding apparatus 2 according to the present invention can include an arbitrary number of decoding stages. Like the de-interleaving circuit 11 incorporated into the concatenated decoding apparatus cannot cause a time delay in the de-interleaving process, any additional de-interleaving stage incorporated into the concatenated decoding apparatus with increase in the number of decoding stages does not cause a time delay. Accordingly, even though the number of decoding stages is increased, the present invention can reconcile a high-speed decoding processing and a high degree of reliability which prior art multiple decoding apparatuses could not ensure.

The error number estimating circuit can calculate the number of error symbols instead of the number of error bits.

Many widely different embodiments of the present invention may be constructed without departing from the spirit and scope of the present invention. It should be understood that the present invention is not limited to the specific embodiments described in the specification, except as defined in the appended claims.

What is claimed is:

1. A multiple coding method comprising the steps of:
encoding a plurality of input sequences in parallel so as to generate a plurality of output coded sequences in parallel while adding an error-correcting bit sequence to each of the plurality of input sequences;
interleaving the plurality of output coded sequences applied thereto in parallel by permuting the plurality of output coded sequences on a bit-by-bit or symbol-by-symbol basis so as to generate a plurality of interleaved coded sequences in parallel; and
encoding the plurality of interleaved coded sequences in parallel so as to generate a plurality of output coded sequences in parallel while adding an error-correcting bit sequence to each of the plurality of interleaved coded sequences.

2. The multiple coding method according to claim 1, wherein the plurality of input sequences to be encoded in said first encoding step are equal in number to those to be encoded in said second encoding step, and the plurality of interleaved coded sequences generated in said interleaving step are equal in number to the plurality of output coded sequences generated in said first encoding step.

3. The multiple coding method according to claim 1, wherein said interleaving step includes the steps of counting a number of bits or symbols sequentially applied thereto and included in one said input sequence generated in said first encoding step, and changing the permutation performed on a bit-by-bit or symbol-by-symbol basis every time a count value obtained in said counting step increments by one.

4. A multiple decoding method comprising the steps of:
decoding a plurality of input sequences in parallel based on an error-correcting bit sequence included in each of the plurality of input sequences so as to generate a plurality of output decoded sequences in parallel;
de-interleaving the plurality of output decoded sequences applied thereto in parallel by permuting the plurality of output decoded sequences on a bit-by-bit or symbol-by-symbol basis so as to generate a plurality of de-interleaved decoded sequences in parallel such that the plurality of de-interleaved decoded sequences are as same as a corresponding plurality of sequences before they were interleaved through a corresponding interleaving process; and
decoding the plurality of de-interleaved decoded sequences in parallel based on an error-correcting bit sequence included in each of the plurality of de-interleaved decoded sequences so as to generate a plurality of output decoded sequences in parallel.

5. The multiple decoding method according to claim 4, wherein the plurality of input sequences to be decoded in said first decoding step are equal in number to those to be decoded in said second decoding step, and the plurality of de-interleaved decoded sequences generated in said de-interleaving step are equal in number to the plurality of output decoded sequences generated in said first decoding step.

6. The multiple decoding method according to claim 4, wherein said de-interleaving step includes the steps of counting a number of bits or symbols sequentially applied thereto and included in one said output decoded sequence generated in said first decoding step, and changing the permutation performed on a bit-by-bit or symbol-by-symbol basis every time a count value obtained in said counting step increments by one.

7. A multiple coding apparatus comprising:
a first encoding means for encoding a plurality of input sequences in parallel so as to generate a plurality of output coded sequences in parallel while adding an error-correcting bit sequence to each of the plurality of input sequences;
an interleaving means for interleaving a plurality of input sequences that are the plurality of output coded sequences applied thereto in parallel from said first encoding means by permuting the plurality of input sequences on a bit-by-bit or symbol-by-symbol basis so as to generate a plurality of interleaved coded sequences in parallel; and
a second encoding means for encoding the plurality of interleaved coded sequences applied thereto in parallel from said interleaving means so as to generate a plurality of output coded sequences in parallel while adding an error-correcting bit sequence to each of the plurality of interleaved coded sequences.

8. The multiple coding apparatus according to claim 7, wherein the plurality of input sequences to be encoded by said first encoding means are equal in number to those to be encoded by said second encoding means, and the plurality of interleaved coded sequences generated by said interleaving means are equal in number to the plurality of output coded sequences generated by said first encoding means.

9. The multiple coding apparatus according to claim 7, wherein said interleaving means includes a counter for counting a number of bits or symbols sequentially applied thereto and included in one said input sequence from said first encoding means, and a plurality of selectors each of which selects a different input sequence from the plurality of input sequences on a bit-by-bit or symbol-by-symbol basis according to a count value of said counter, and furnishes the selected input sequence as one interleaved coded sequence on a bit-by-bit or symbol-by-symbol basis, a number of said plurality of selectors being equal to a number of the plurality of input sequences.

10. The multiple coding apparatus according to claim 9, wherein each of said plurality of selectors selects a same input sequence every time it performs the selection a predetermined number of times corresponding to the number of the plurality of input sequences.

11. The multiple coding apparatus according to claim 7, wherein each of said first and second encoding means adds the error-correcting bit sequence to each of the plurality of input sequences applied thereto using a Reed-Solomon coding method.

12. The multiple coding apparatus according to claim 7, further comprising a second interleaving means for interleaving a plurality of input sequences applied thereto in parallel by permuting the plurality of input sequences on a bit-by-bit or symbol-by-symbol basis so as to generate and furnish a plurality of interleaved sequences in parallel to said first encoding means.

13. A multiple decoding apparatus comprising:
a first decoding means for decoding a plurality of input sequences in parallel based on an error-correcting bit sequence included in each of the plurality of input sequences so as to generate a plurality of output decoded sequences in parallel;
a de-interleaving means for de-interleaving a plurality of input sequences that are the plurality of output decoded sequences applied thereto in parallel from said first decoding means by permuting the plurality of output decoded sequences on a bit-by-bit or symbol-by-symbol basis so as to generate a plurality of de-interleaved decoded sequences in parallel such that the plurality of de-interleaved decoded sequences are as same as a corresponding plurality of input sequences before they were interleaved using a corresponding interleaving technique; and
a second decoding means for decoding the plurality of de-interleaved decoded sequences applied thereto in parallel from said de-interleaving means based on an error-correcting bit sequence included in each of the plurality of de-interleaved decoded sequences so as to generate a plurality of output decoded sequences in parallel.

14. The multiple decoding apparatus according to claim 13, wherein the plurality of input sequences to be decoded by said first decoding means are equal in number to those to be decoded by said second decoding means, and the plurality of de-interleaved decoded sequences generated by said de-interleaving means are equal in number to the plurality of output decoded sequences generated by said first decoding means.

15. The multiple decoding apparatus according to claim 13, wherein said de-interleaving means includes a counter for counting a number of bits or symbols sequentially applied thereto and included in one said input sequence from said first decoding means, and a plurality of selectors each of which selects a different input sequence from the plurality of input sequences on a bit-by-bit or symbol-by-symbol basis according to a count value of said counter, and furnishes the selected input sequence as one de-interleaved decoded sequence on a bit-by-bit or symbol-by-symbol basis, a number of said plurality of selectors being equal to a number of the plurality of input sequences.

16. The multiple decoding apparatus according to claim 15, wherein each of said plurality of selectors selects a same input sequence every time it performs the selection a predetermined number of times corresponding to the number of the plurality of input sequences.

17. The multiple decoding apparatus according to claim 13, wherein each of said first and second decoding means decodes the plurality of input sequences applied thereto in parallel using a Reed-Solomon coding method.

18. The multiple decoding apparatus according to claim 13, further comprising an interleaving means for interleaving the plurality of output coded sequences applied thereto in parallel from said second decoding means by permuting the plurality of output coded sequences on a bit-by-bit or symbol-by-symbol basis so as to generate a plurality of interleaved coded sequences in parallel, a third decoding means for performing a same decoding process as performed by said first decoding means on the plurality of interleaved coded sequences applied thereto in parallel from said interleaving means so as to generate a plurality of output decoded sequences in parallel, a second de-interleaving means for performing a same de-interleaving process as performed by said first de-interleaving means on the plurality of output decoded sequences applied thereto in parallel from said third decoding means so as to generate a plurality of de-interleaved decoded sequences in parallel, and a fourth decoding means for performing a same decoding process as performed by said second decoding means on the plurality of de-interleaved decoded sequences applied thereto in parallel from said second de-interleaving means so as to generate a plurality of output decoded sequences in parallel, wherein the plurality of error-correcting bit sequences used by said first decoding means are transferred to said third decoding means in order for said third decoding means use them when decoding the plurality of interleaved coded sequences from said interleaving means, and the plurality of error-correcting bit sequences used by said second decoding means are transferred to said fourth decoding means in order for said fourth decoding means use them when decoding the plurality of de-interleaved decoded sequences from said second de-interleaving means.

19. The multiple decoding apparatus according to claim 13, further comprising an error number estimating means for calculating a number of all error bits or symbols corrected by said first and second decoding means and assuming the number as a number of errors that have occurred in a transmission medium via which input sequences are transmitted to said multiple decoding apparatus.

20. An information transmission system comprising:

a multiple coding apparatus including a first encoding means for encoding a plurality of input sequences in parallel so as to generate a plurality of output coded sequences in parallel while adding an error-correcting bit sequence to each of the plurality of input sequences, an interleaving means for interleaving a plurality of input sequences that are the plurality of output coded sequences applied thereto in parallel from said first encoding means by permuting the plurality of input sequences on a bit-by-bit or symbol-by-symbol basis so as to generate a plurality of interleaved coded sequences in parallel, a second encoding means for encoding the plurality of interleaved coded sequences applied thereto in parallel from said interleaving means so as to generate a plurality of output coded sequences in parallel while adding an error-correcting bit sequence to each of the plurality of interleaved coded sequences, and an output means for sending out the plurality of output coded sequences from said second encoding means, as a plurality of concatenated coded sequences, on a transmission medium; and a multiple decoding apparatus including an input means for receiving the plurality of concatenated coded sequences from said transmission medium and furnishing the plurality of concatenated coded sequences as a plurality of input sequences, a first decoding means for decoding the plurality of input sequences in parallel based on an error-correcting bit sequence included in each of the plurality of input sequences so as to generate a plurality of output decoded sequences in parallel, a de-interleaving means for de-interleaving a plurality of input sequences that are the plurality of output decoded sequences applied thereto in parallel from said first decoding means by permuting the plurality of output decoded sequences on a bit-by-bit or symbol-by-symbol basis so as to generate a plurality of de-interleaved decoded sequences in parallel such that the plurality of de-interleaved decoded sequences are as same as the corresponding plurality of input sequences before they were interleaved by said interleaving means of said multiple coding apparatus, and a second decoding means for decoding the plurality of de-interleaved decoded sequences applied thereto in parallel from said de-interleaving means based on an error-correcting bit sequence included in each of the plurality of de-interleaved decoded sequences so as to generate a plurality of output decoded sequences in parallel.

* * * * *